(12) United States Patent
Comparan et al.

(10) Patent No.: US 12,048,256 B2
(45) Date of Patent: Jul. 23, 2024

(54) INTERFACING WITH SUPERCONDUCTING CIRCUITRY

(71) Applicant: Microsoft Technology Licensing, LLC, Redmond, WA (US)

(72) Inventors: Miguel Comparan, Kenmore, WA (US); Adam James Muff, Woodinville, WA (US); Indranil Sen, Bellevue, WA (US); Paul D Berndt, Shoreline, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 532 days.

(21) Appl. No.: 17/241,688

(22) Filed: Apr. 27, 2021

(65) Prior Publication Data
US 2022/0344563 A1  Oct. 27, 2022

(51) Int. Cl.
*H10N 60/84* (2023.01)
*G06N 10/00* (2022.01)

(52) U.S. Cl.
CPC ............. *H10N 60/84* (2023.02); *G06N 10/00* (2019.01)

(58) Field of Classification Search
None
See application file for complete search history.

(56) References Cited

U.S. PATENT DOCUMENTS

| | | | | |
|---|---|---|---|---|
| 4,873,482 A * | 10/1989 | Gray | ............... | G01T 1/1606 324/71.6 |
| 5,030,614 A * | 7/1991 | Hollander | ............... | G01R 33/1246 505/231 |
| 5,942,997 A * | 8/1999 | Silver | ............... | H03M 1/121 341/171 |
| 6,518,786 B2 * | 2/2003 | Herr | ............... | H03K 19/1954 326/6 |
| 6,750,794 B1 * | 6/2004 | Durand | ............... | H03M 1/62 341/143 |
| 7,680,474 B2 * | 3/2010 | Kirichenko | ............... | H03D 7/005 370/335 |
| 7,724,020 B2 * | 5/2010 | Herr | ............... | H03K 19/0008 326/6 |

(Continued)

OTHER PUBLICATIONS

"International Search Report and Written Opinion Issued in PCT Application No. PCT/US22/025154", Mailed Date: May 10, 2023, 20 Pages.

(Continued)

*Primary Examiner* — David P Porta
*Assistant Examiner* — Djura Malevic
(74) *Attorney, Agent, or Firm* — Fountainhead Law Group P.C.

(57) ABSTRACT

Embodiments of the present disclosure include techniques for interfacing with superconducting circuits and systems. In one embodiment, the present disclosure includes interface circuitry, including driver circuits and/or receiver circuits to send/receive signals with a superconducting circuit. In another embodiment, the present disclosure includes superconducting circuits and techniques for generating a trigger signal from and external clock that is based on a superconducting resonator. In yet another embodiment, the present disclosure includes superconducting data capture circuits that may be used to couple external data to and/or from superconducting logic.

19 Claims, 8 Drawing Sheets

(56) References Cited

U.S. PATENT DOCUMENTS

| | | | | |
|---|---|---|---|---|
| 7,763,854 B2* | 7/2010 | Frey | | G01J 1/0209 |
| | | | | 250/336.2 |
| 8,401,600 B1* | 3/2013 | Filippov | | H10N 60/12 |
| | | | | 505/190 |
| 8,489,163 B2* | 7/2013 | Herr | | H03K 3/38 |
| | | | | 505/190 |
| 8,571,615 B2* | 10/2013 | Hays | | G01R 33/035 |
| | | | | 505/191 |
| 8,872,109 B2* | 10/2014 | Ohkubo | | H10N 60/84 |
| | | | | 250/336.2 |
| 9,240,539 B2* | 1/2016 | Nam | | H10N 60/01 |
| 9,543,959 B1* | 1/2017 | Carmean | | H03K 19/20 |
| 9,652,571 B2* | 5/2017 | Shauck | | G06F 30/394 |
| 10,090,841 B1* | 10/2018 | Herr | | G06N 10/00 |
| 10,311,369 B2* | 6/2019 | Epstein | | G06N 10/00 |
| 10,331,163 B1* | 6/2019 | Luo | | H03K 19/1952 |
| 10,355,681 B1* | 7/2019 | Inamdar | | H03L 7/0805 |
| 10,411,713 B2* | 9/2019 | Harms | | H03K 19/21 |
| 10,554,207 B1* | 2/2020 | Herr | | G11C 11/44 |
| 10,615,783 B2* | 4/2020 | Powell, III | | H03K 19/195 |
| 10,650,319 B2* | 5/2020 | Medford | | G06N 10/00 |
| 10,680,617 B2* | 6/2020 | Rylov | | G06F 1/10 |
| 10,756,712 B2* | 8/2020 | Braun | | H03K 3/38 |
| 10,769,344 B1* | 9/2020 | Schneider | | H03K 19/1952 |
| 11,201,608 B2* | 12/2021 | Galan | | H03K 3/38 |
| 11,233,516 B1* | 1/2022 | Whiteley | | H03K 17/92 |
| 11,380,835 B2* | 7/2022 | Schneider | | H03K 19/195 |
| 11,385,099 B1* | 7/2022 | Jafari-Salim | | G01J 1/0425 |
| 11,747,196 B1* | 9/2023 | Jafari-Salim | | G01J 1/0425 |
| | | | | 250/208.1 |
| 2004/0150458 A1* | 8/2004 | Gupta | | H03M 1/12 |
| | | | | 341/100 |
| 2009/0184252 A1* | 7/2009 | Tanaka | | G01T 1/1606 |
| | | | | 378/43 |
| 2015/0199178 A1* | 7/2015 | Shi | | G06N 10/00 |
| | | | | 708/254 |
| 2017/0117901 A1* | 4/2017 | Carmean | | H03K 19/20 |
| 2018/0350411 A1* | 12/2018 | Ware | | G11C 7/04 |
| 2020/0106444 A1* | 4/2020 | Herr | | G11C 8/16 |
| 2022/0344563 A1* | 10/2022 | Comparan | | H10N 60/84 |

OTHER PUBLICATIONS

"Invitation to Pay Additional Fees Issued in PCT Application No. PCT/US22/025154", Mailed Date: Mar. 17, 2023, 12 Pages.

Oliver Timothy Obert et al., "Superconducting Logic Circuits Operating With Reciprocal Magnetic Flux Quanta", 337 pages, Feb. 17, 2012.

Wayne P. Burleson et al., "Wave-Pipelining: A Tutorial and Research Survey", IEEE Transactions on Very Larg Scale Integration (VLSI) Systems, vol. 6, No. 3, 11 pages, Sep. 1998.

Quentin P. Herr et al., "Ultra-low-power superconductor logic", Journal of Applied Physics, 9 pages, Jan. 25, 2011.

* cited by examiner

INTERFACING WITH SUPERCONDUCTING CIRCUITRY

BACKGROUND

The present disclosure relates generally to techniques for interfacing with superconducting circuits.

Superconducting circuits are circuits that typically run at very low temperatures and employ electromagnetic phenomena described by quantum mechanics. One example superconducting circuit technique uses Josephson junctions, which are electrical devices in which two superconducting metals are separated by a thin layer of insulator, across which an electric current may flow in the absence of a potential difference. The current may be made to oscillate in proportion to an applied potential difference. A variety of combinational logic functions can be implemented using superconductor circuit. Because superconductors have very little or no resistance, such circuits can be very fast and power efficient.

However, superconducting circuits typically operate at very low temperatures, which may be on the order of milliKelvins (mK). Accordingly, interfacing with such circuits is a challenge. For example, testing logic implemented in superconducting circuits may require test equipment, operating at room temperature (e.g., 300K) to interface with circuitry operating at very low temperatures.

One challenge with superconductor interfaces is that data in a superconducting circuit is typically represented differently than data in contemporary electronics. In CMOS circuits, for example, 0 s and is are represented using binary voltage values (e.g., 0-3.3 v, 0-5 v, and the like), whereas in superconducting circuits 0 s and is may be represented differently (e.g., as pulses). Converting between data representations at a superconducting interface with test equipment may require complex conversions of the electrical signals.

Another challenge with superconductor interfaces is that the data rates on superconductors can be very high compared to typical clock speeds of test equipment.

The following disclosure includes techniques for interfacing with superconducting circuitry that address some of these challenges and others.

DETAILED DESCRIPTION

Figure 1:
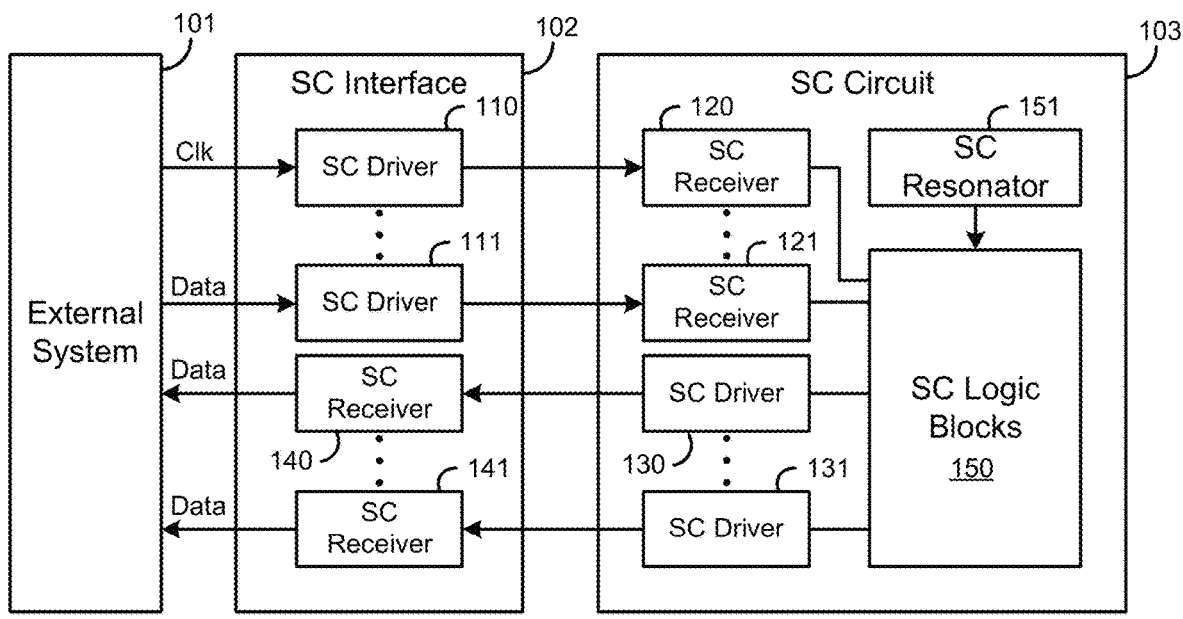
FIG. 1 illustrates a superconducting circuit interfacing with an external system according to an embodiment.

Described herein are techniques for interfacing with superconducting circuits. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

In some embodiments, features and advantages of the present disclosure include circuit techniques to sending and receiving signals to and from a superconducting circuit. In other embodiments, the present disclosure includes techniques for interfacing superconducting circuits that may have a high resonant frequency with external circuits having a lower frequency. In yet other embodiments, the present disclosure includes techniques for sending data to and receive data from superconducting data capture circuits, which may be used to test combinational login in a superconducting circuit, for example. In one embodiment, in one mode the superconducting data capture circuits receive data from an external system (e.g., for testing), and in another mode the superconducting logic is configured for wave pipeline operation.

Superconducting digital logic circuits according to various embodiments may use single flux quanta (SFQ), also known as magnetic flux quanta, to encode, process, and transport data. SFQ circuits are made up of active Josephson junctions and passive elements such as inductors, resistors, transformers, and transmission lines. Superconducting circuits according to various embodiments may be implemented using Reciprocal Quantum Logic (RQL). RQL uses reciprocal pairs of SFQ pulses to encode a logical '1'. Examples of RQL logic that may be used in various embodiments are described in "Ultra-low-power superconductor logic," J. Appl. Phs. 109, 103903 (2011); https://doi.org/10.1063/1.3585849, 17 May 2011, by Quentin P. Herr, Anna Y. Herr, Oliver T. Oberg, and Alexander G. Ioannidis, the entire contents of which are hereby incorporated herein by reference for all purposes.

In one example application, the external system may be a test system, such as test equipment using the IEEE1149.1 JTAG protocol, for example. Typically, interfacing with superconducting circuits requires expensive equipment that can operate not only at the high frequencies of superconducting resonators on the SC circuit, but also at the milli-volt levels required by the superconducting interface. Using industry standard slow speed communication interfaces on a superconducting design, like IEEE1149.1 JTAG or other slow speed communication protocols, advantageously allows accessibility to existing cheaper tools used by the CMOS industry.

To implement a JTAG or slow speed interface compatible to superconducting logic requires additional signal conditioning and signal capture capabilities to bridge compatibility between superconducting logic and standard signal requirements of JTAG or other low speed interfaces. Such an interface may have multiple challenges. First, the superconducting circuit inputs may require a very fast edge rate (e.g., rise and fall times on the order of 100 picoseconds) versus the standard JTAG signal outputs from a dongle or CMOS interface chip. Additionally, superconducting circuit inputs may require small signals on the order of 10 s to 100 s of milli-Volts versus full CMOS or TTL levels from standard JTAG signal outputs from a dongle or CMOS interface chip. Additionally, superconducting circuit output signal levels may be very small (e.g., on the order of 2 to 4 milli-Volts), which are not compatible with standard JTAG levels, for example. Moreover, superconducting circuit outputs are very sensitive and may require AC coupling, which may result in significant DC wander. Finally, level translation from superconducting circuit levels to external low speed interfaces, such as standard JTAG, may also be required.

Furthermore, in some applications, a slow speed of the interface adds additional complexity when interacting with the high-speed superconducting circuit. A slow speed external clock may be an ~50% duty cycle clock, for example. Such a clock cannot be used directly since the superconducting circuit does not contain traditional CMOS flip-flops. In various embodiments described herein, an external clock may be converted to high frequency pulses the form a RQL clock signal, for example, which can be used by the superconducting circuit. Accordingly, embodiments of the present disclosure may include a transition (edge) detection circuit that receives an RQL representation of the slow external clock and generates a logic pulse that indicates the rising edge of the slow clock. A second logic pulse may further be generated for the falling edge of the slow clock, which may be useful for a JTAG compliant interface, for example. These pulses may be used as capture indicators that mimic traditional CMOS flip-flops inside the superconducting circuit. As described further below, when a pulse is high, the full speed of the superconducting logic circuit is executed, and when the pulse is low, a superconducting data capture point may recirculate a stored value, for example. Data capture points described herein may receive the pulses at the same time, for example, to maintain consistency in the superconducting logic. Thus, some embodiments may match the latency of the pulses, for example. The maximum frequency of the slow clock may be dependent on the longest latency between two data capture points. When the slow speed interface is not in use, the pulses may remain high allowing the superconducting circuit to meet its maximum performance, for example.

FIG. 1 illustrates a superconducting (SC) circuit 103 interfacing with an external system 101 according to an embodiment. External system may be a JTAG test system, for example, which generates and send a digital clock signal and data to a superconducting (SC) interface 102. SC interface 102 includes a plurality of driver circuits 110-111 (e.g., CMOS-SC) to convert the signal levels of the clock and data to levels that can be received by SC circuit 103 (e.g., 10 s to 100 s of mVs with rise/fall times around 100 ps). These signals are sent to SC receivers 120-121 on SC circuit 103. SC receivers 120-121 convert the received signals from high/low voltage logic representations to pulse logic representations of clock and data signals.

SC circuit 103 includes one or more SC logic blocks 150 and an SC resonator 151. SC logic blocks 150 may implement simple or complex operations using traditional logic, such as AND, OR, NOT (inverters), XOR (exclusive OR), and the like, to form a wide variety of combinational logic blocks to process data, for example. SC resonator 151 provides baseline timing for the operations performed by SC circuit 103. SC resonator 151 may provide a system clock (e.g., an RQL system clock), which may have very high frequency RQL pulses that define logical pulse widths corresponding to a traditional digital H/L clock, for example.

Figure 2:
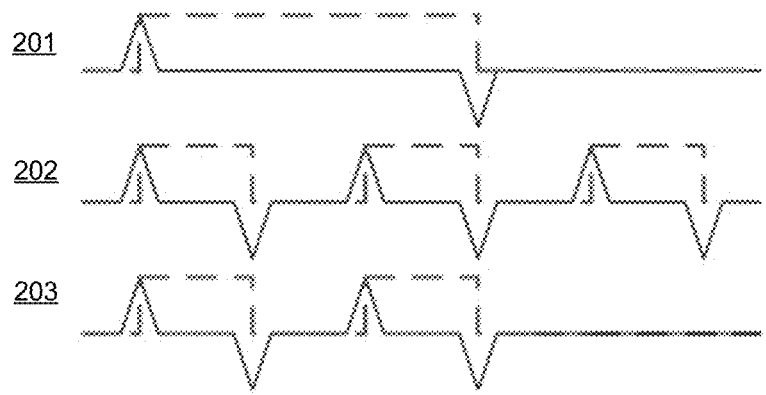
FIG. 2 illustrates an example of digital signaling and Reciprocal Quantum Logic (RQL) signaling.

FIG. 2 illustrates an example of digital signaling and Reciprocal Quantum Logic (RQL) signaling. At 201, the dashed line 210 shows a traditional digital logic signal where logic 1 is represented by a higher voltage than logic 0. RQL may represent data as pulses. Here, the region between a high pulse followed by a low pulse represents a logic 1. Similarly, a low pulse followed by a high pulse represents a logic 0. A higher frequency clock is illustrated at 202. Values of 10100 . . . etc. are illustrated at 203.

Referring again to FIG. 1, data generated by SC logic blocks 150 may be coupled to external system 101 through SC drivers 130-131, which are coupled to SC receivers 140-141 in SC interface 102. SC receivers 140-141 receive SC pulse representations logical data and convert the received signals to digital data representations (e.g., high and low voltages), which may then be sent to external system 101 for further processing.

Figure 3:
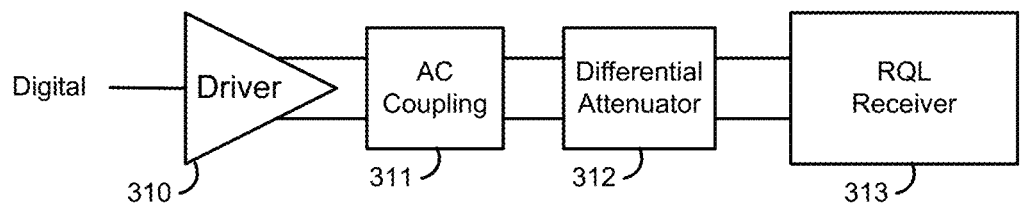
FIG. 3 illustrates an interface driver circuit according to an embodiment.

FIG. 3 illustrates an interface driver circuit according to an embodiment. In this example, a differential driver 310 provides a single end input to differential fast edge driven output, which drives into a differential attenuator 312 through AC coupling 311. The speed of the driver, AC coupling, and attenuation may be configured to provide an edge rate (e.g., 100 ps), signal level (10-100 mV), and DC offset compatible with a superconducting logic input, for example. Differential attenuator 312 is, in turn, coupled to an RQL receiver 313. In the circuit depicted in FIG. 3, the digital signal is converted to a fast-edge rate through the attenuator so the RQL receiver on the SC Chip input sees the attenuated level and the fast-edge rate. The RQL receiver input takes the fast-edges and translates those to RQL pulses. The RQL pulses are create based on the edges, rather than the high and low (H/L) digital voltage levels. The connection between the driver to the SC-Input is AC coupled so H/L levels are not maintained and may include DC drift in the signaling. Accordingly, the edges are actually conveying the clock and data values. A more detailed example of an interface driver circuit is provided below.

Figure 4:
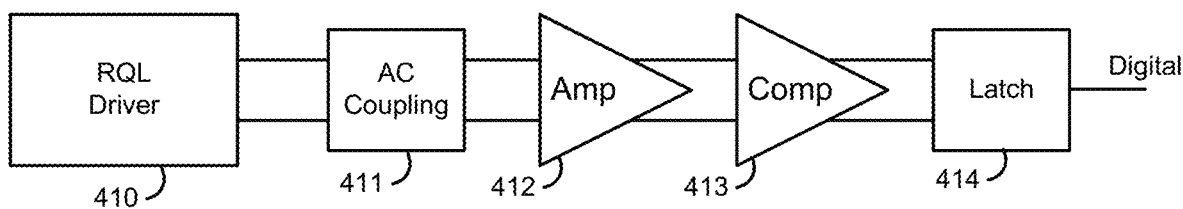
FIG. 4 illustrates an interface receiver circuit according to an embodiment.

FIG. 4 illustrates an interface receiver circuit according to an embodiment. In this example, an RQL driver 410 has a differential output coupled to a differential input of amplifier 412 through AC coupling 411. Amplifier 412 provides the amplification of RQL signals to drive a comparator 413 to capture a rising or falling edge, which in turn drives a latch 414 to provide the final static and correct output voltage level. Accordingly, the first part of the receiver amplifies the RQL signal, then the "comparator-FF" arrangement transforms the RQL signal (pulses) to a digital voltage signal (high/low format).

Figure 5:
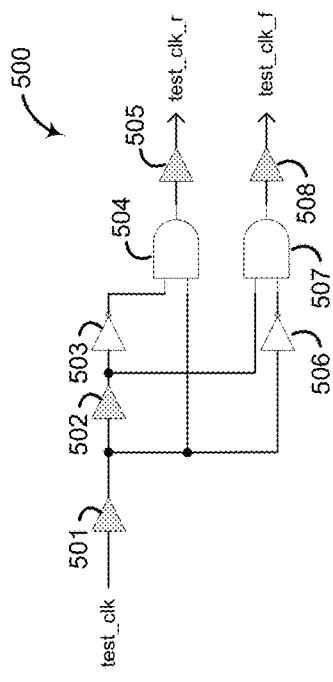
FIG. 5 illustrates an RQL transition detection circuit according to an embodiment.

FIG. 5 illustrates an RQL transition detection circuit 500 according to an embodiment. As mentioned above, a digital clock signal may be sent from an external system, such as a test system, to an SC circuit. A digital clock signal may be coupled through an interface driver (e.g., driver 110) and converted to an RQL clock signal (e.g., a low frequency digital clock represented as RQL pulses) by an RQL receiver circuit (e.g., SC receiver 120), for example. An RQL transition detection circuit 500 may be configured to receive the RQL clock signal (here, test_clk, generated from the external clock) and generate one or more RQL logic pulse signals corresponding to logic transitions of the external digital clock signal, for example. The RQL logic pulse signals may have a logical pulse width equal to a logical pulse width of a superconducting resonator circuit.

In this example, RQL transition detection circuit 500 comprises delay circuits, inverters and AND circuits implemented as RQL circuits. the RQL delay circuits may have a time delay equal to a logical pulse width of the superconducting resonator circuit (e.g., the time between opposite RQL pulses), for example. The input "test_clk" is received by a delay circuit 501 and coupled to a second delay circuit 502. RQL delay circuits 501 and 502 have input coupled to receive the RQL clock signal. RQL inverter 503 is coupled to an output of delay circuit 502. An RQL AND circuit 504 has a first input coupled to the input of RQL delay circuit 502 and a second input coupled to an output of RQL inverter 503. Accordingly, when test_clk transitions from 0 to 1 (rising edge), the inputs of the AND circuit are both at 1 for a period of time equal to the delay of delay circuit 502 (e.g., the logical pulse width of the resonator). Thus, the output of AND circuit 504 produces an RQL logic pulse signal corresponding to a rising transition of the digital clock signal and having a logical pulse width equal to a logical pulse width of a superconducting resonator circuit.

RQL transition detection circuit further includes RQL inverter 506 coupled to the input of the RQL delay circuit 502. RQL AND circuit 507 has a first input coupled to the output of the RQL delay circuit and a second input coupled to an output of RQL inverter 506. An output of RQL AND circuit is an RQL logic pulse signal corresponding to a falling transition of the digital clock signal and having a logical pulse width equal to a logical pulse width of the superconducting resonator circuit.

Figure 6:
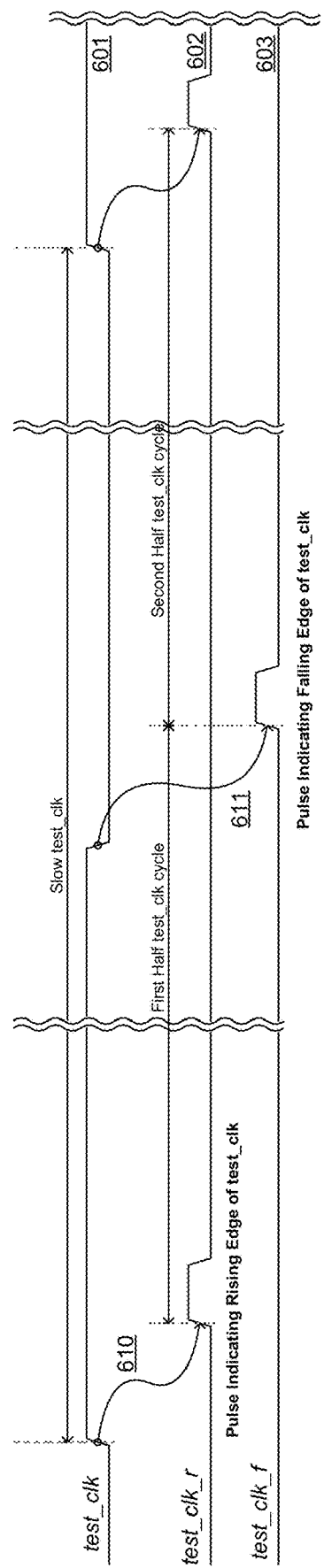
FIG. 6 illustrates a logical RQL clock signal and RQL logic pulse signals according to an embodiment.

FIG. 6 illustrates a logic RQL clock signal 601 and RQL logic pulse signals 602 and 603 according to an embodiment. Clock signal 601 is referred to as a "logic" RQL clock signal and RQL pulses 602 and 603 are referred to as "logic" pulse signals because the RQL pulses correspond to, and are depicted here as, logic 0 s and 1 s. As illustrated in FIG. 6, the rising edge of test_clk produces a logic pulse having a pulse width set by a delay circuit as shown at 610. Similarly, the falling edge of test_clk produces a logic pulse having a pulse width set by a delay circuit as shown at 611.

Figure 7:
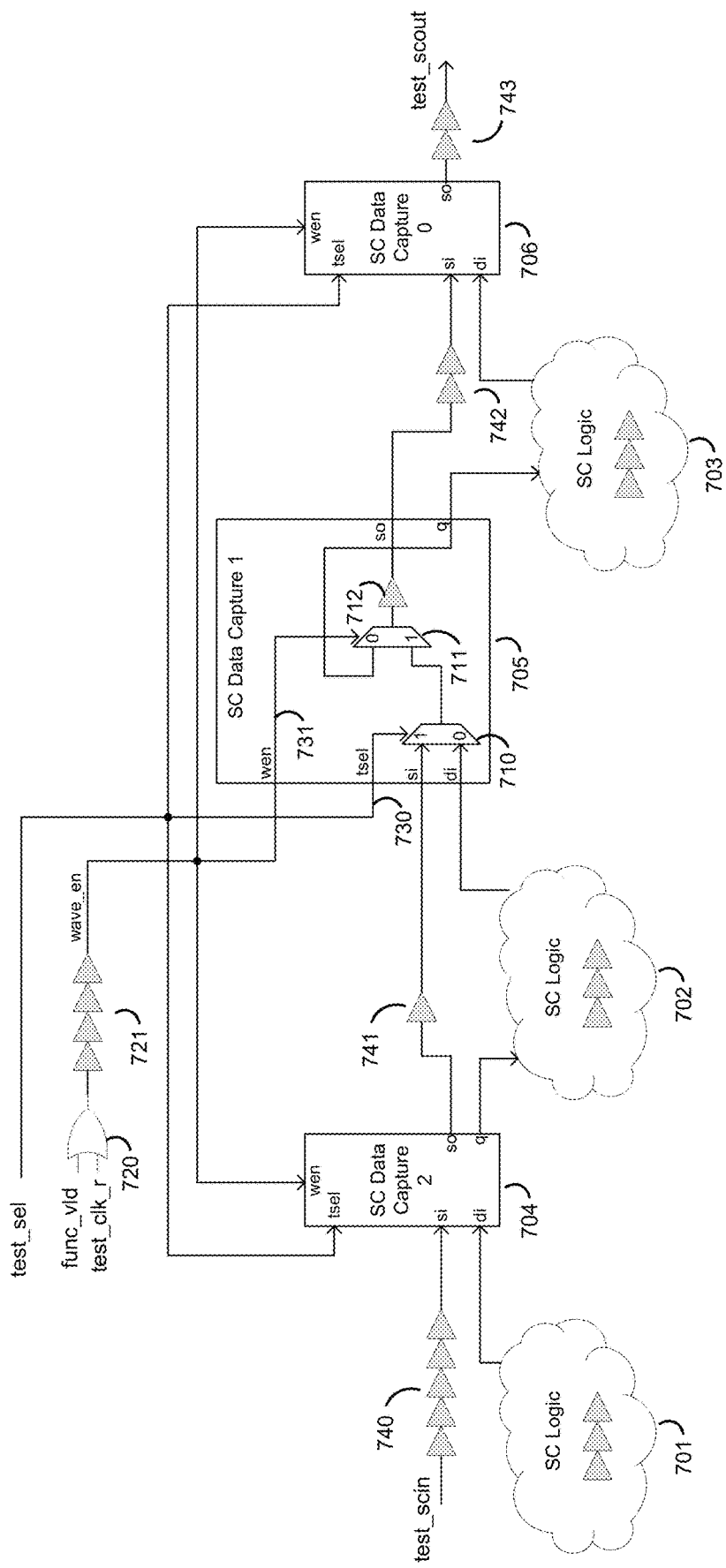
FIG. 7 illustrates superconducting data capture circuits used to test superconducting logic according to an embodiment.

FIG. 7 illustrates superconducting data capture circuits used to test superconducting logic according to an embodiment. As mentioned above, features and advantages of some embodiments include data capture points in an SC circuit. FIG. 7 illustrates a plurality of SC logic circuits 701-703. Inputs and outputs of the SC logic may be coupled to data capture points 704-705 to couple data into particular SC logic or couple data from particular SC logic (or both). The various configurations of SC logic and SC data capture circuits are sometimes used to implement wave pipeline circuits, for example. The example in FIG. 7 shows how serial test data may be shifted in, and results shifted out, of an SC circuit using data capture points 704-706. In various embodiments, SC logic circuits may be coupled to a plurality of SC data capture circuits configured in series in a variety of ways. As illustrated here, SC data capture circuits may have outputs coupled to inputs of certain SC logic circuits and SC data capture circuits may have inputs coupled to outputs of the SC logic circuits. The present arrangement in FIG. 7 is merely illustrative. The circuits shown in FIG. 7 may be implemented on an SC circuit in RQL logic, for example.

In this example, a test superconducting circuit data input, "test_scin," is coupled through delay circuits 740 to the serial input, si, of a first SC data capture circuit 704. A serial output, so, of SC data capture circuit 704 is coupled to another serial input of SC data capture circuit 705 through delay circuit 741. Similarly, serial output of SC data capture circuit 705 is coupled to another serial input of SC data capture circuit 706 through two (2) delay circuits 742, and the serial output of SC data capture circuit 706 is coupled through delay circuits 743 to test superconducting circuit data output, "test scout."

SC data capture circuit 705 illustrates example circuits used in the data capture circuits. SC data capture circuits may include multiplexer 710 comprising a first input configured to receive a serial data input from an upstream SC data capture circuit, a second input, a select input, and an output. Multiplexer 711 includes a first input coupled to the output of multiplexer 710, a second input, a select input, and an output. A delay circuit 712 includes an input coupled to the output of multiplexer 711 and an output coupled to the second input of multiplexer 711 to store data received at the first or second inputs of multiplexer 711. In this example, a second input of multiplexer 710 is coupled to an output of an SC logic circuit (here, SC logic 702). Similarly, SC data capture circuits include a data output, q, coupled to an input of an SC logic circuit (here, SC logic 703).

During operation, a test select signal, "test_sel," coupled to the select input of multiplexer 710 may be set to logic high to place the circuit in a shift mode so that the serial input is coupled through multiplexer 710. The test select signal may be coupled to a plurality of the input select multiplexers in the SC data capture circuits, for example. Additionally, the RQL logic pulses from the transition detect circuit (mentioned above) may be used as a test clock to control the flow of data into and out of the SC data capture circuits. Here, the rising edge RQL logic pulse, "test_clk_r," is coupled through an OR circuit and delay circuits 721 to produce a wave enable signal, "wave_en," which is coupled to the select input of multiplexer 711. When test_clk_r is high and test_sel is high, data from a previous SC data capture stage is coupled through multiplexers 710 and 711, and when test_clk_r pulse goes to logic low, the data from the previous (upstream) stage is stored in the subsequent (downstream) stage. Accordingly, data may be shifted between the SC data capture circuits on each rising edge of the external clock and stored on multiplexer-delay loop in each SC data capture circuit. As mentioned above, SC data capture circuits may receive the pulses at the same time to maintain consistency in the superconducting logic. Accordingly, the latency of the wave_en signal from the output of the last delay circuit 721 to each multiplexer select input may be configured to be the same so that the timing of the shifting data is consistent. In this example, test_clk_r is high for the same time a resonator pulse is logic high. Thus, at least one delay circuit (e.g. circuit 741) is placed between SC data capture circuits to ensure upstream data values do not shoot through to subsequent downstream stages when test_clk_r is logic high. On the other hand, the delay between each SC data capture circuit should be less than the time between test_clk_r going high (e.g., less than the period of the external clock signal) to ensure the output of an upstream SC data capture circuit has time to propagate to the downstream SC data capture circuit between each activation of test_clk_r.

In a functional mode, test_sel and test_clk_r may be set to logic low and func_vld (function valid)/wave_en (wave enable) set to logic high. In this mode, data from SC logic is coupled through multiplexers 710 and 711 at a full speed of the superconducting circuitry. In this mode the SC logic may be configured for wave pipelining, for example. In functional mode, data may be processed by an SC logic circuit and captured in an SC data capture circuit. When func_vld goes low, an output of an SC logic circuit may be stored on multiplexer-delay loop 711-712. Accordingly, in functional mode the SC data capture circuits shift data out from outputs of the SC logic circuit.

Figure 8:
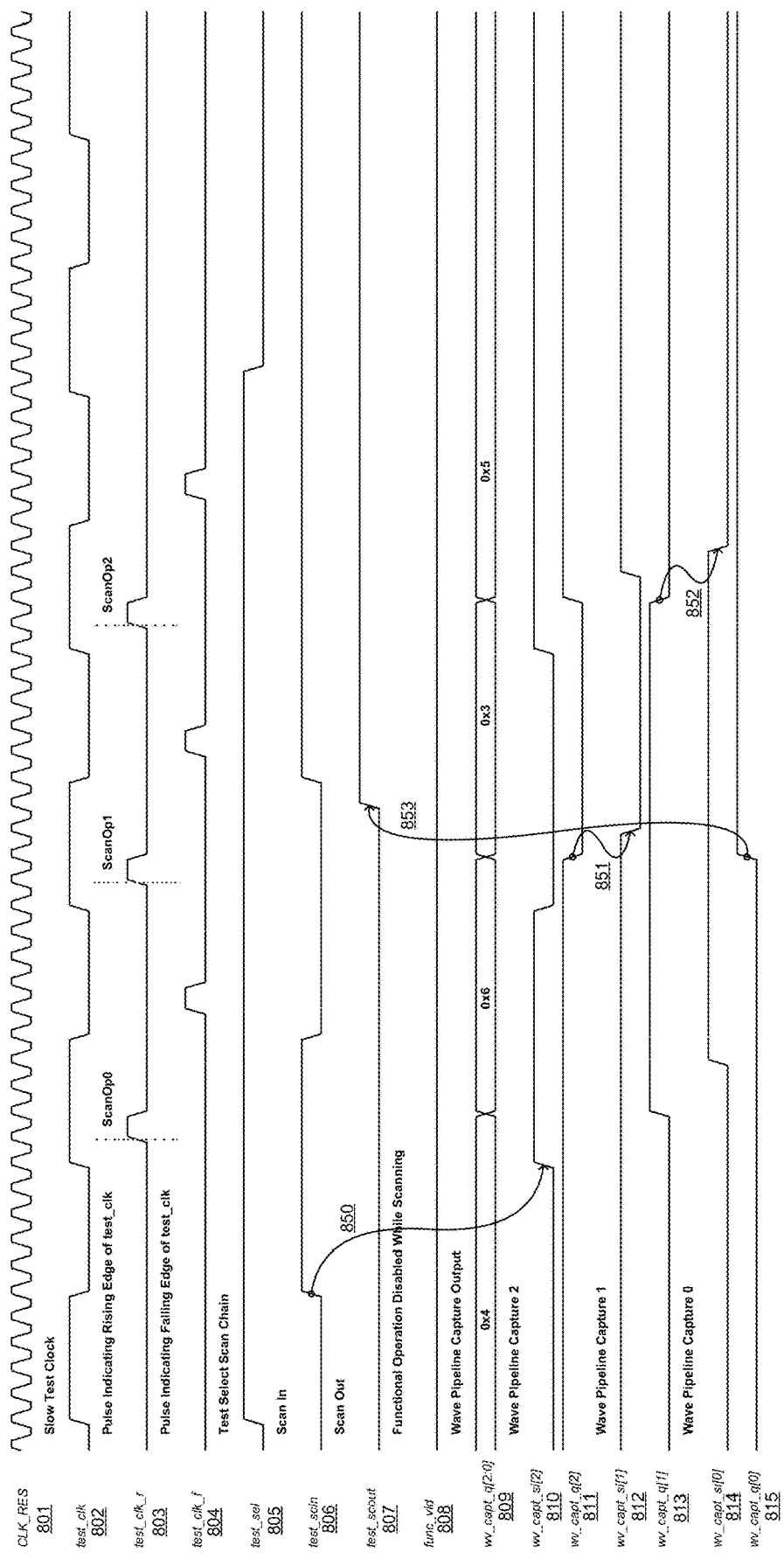
FIG. 8 illustrates a waveform diagram illustrating the operation of superconducting data capture circuits according to an embodiment.

FIG. 8 illustrates a waveform diagram illustrating the operation of superconducting data capture circuits according to an embodiment. In this example, a digital logic value of 101 (e.g., the number 5) is shifted into SC data capture circuits 704 (register 2), 705 (register 1), and 706 (register 0). 801 illustrates the logical (represented as H/L) resonant clock signal. The logical representation of the external test clock, test_clk, is shown at 802. The rising and falling edge logic pulses are shown at 803 and 804, respectively. Test select is shown going high at 805 to shift data into the SC data capture circuits. The input data values on test_scin are shown at 806 and the output data values (register 0 output) on test scout are shown at 807. Function valid, func_vld is shown as low during shifting at 808. The values in registers 0-2 on the "q" outputs, wv_capt_q[2], are shown at 809, which initially start at 100 (the number 4) and end in 101 (the number 5). The "si" input of SC data capture circuit 704 (register 2) is shown to illustrate the delay caused by delay circuits 740 at 850. Delay circuits between the other SC data capture circuits are illustrated at 851 and 852, and the output delay 743 is illustrated at 853. Waveforms at 810-815 show the "si" and "q" logic values over time for SC data capture circuits 704-706.

Figure 9:
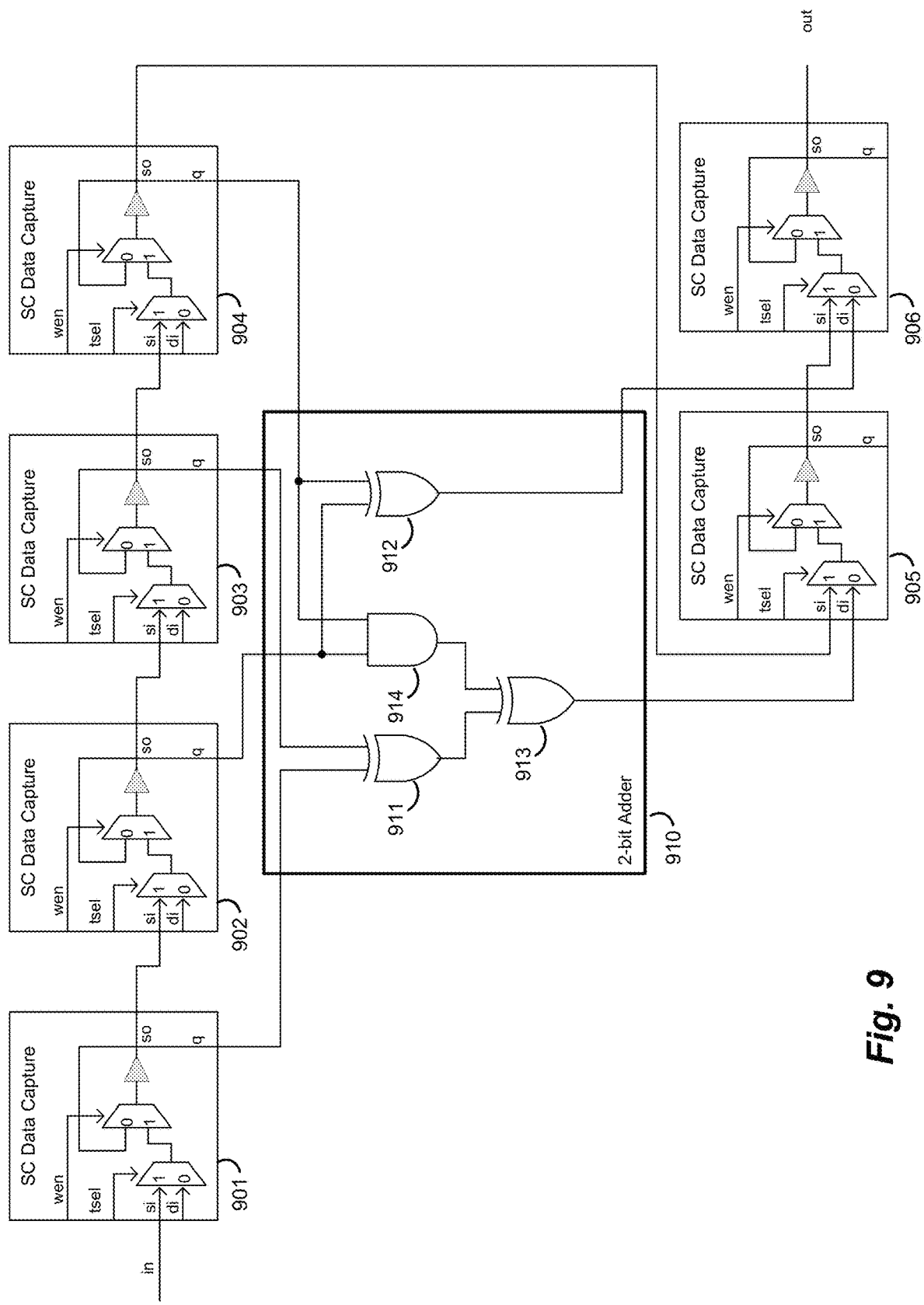
FIG. 9 illustrates superconducting data capture circuits used to test an adder circuit according to an embodiment.

FIG. 9 illustrates superconducting data capture circuits used to test an adder circuit according to an embodiment. This simple illustrative example shows SC data capture circuits 901-906 configured in series to test a 2-bit adder circuit. In a test mode, test select, "tsel," is set to logic high and wave enable, "wen," receives logical pulses based on an edge of an external clock. Accordingly, each SC data capture circuit 901-906 captures the logical value on the "si" input and produces the value on the output, "so," on each edge of the external clock, and data on "in" is successively shifted from the input to the output of each SC data capture circuit.

In this example, adder 910 comprises 3 XOR circuits and an AND circuit implemented using superconducting logic. Four (4) bits may be shifted into SC data capture circuits 901-904 from an external test system, such as a JTAG system, to test adder 910. The output of adder 910 is coupled to SC data capture circuits 905-906. The outputs of the adder may be shifted out to the external test system for analysis through SC data capture circuits 905-906.

Figure 10:
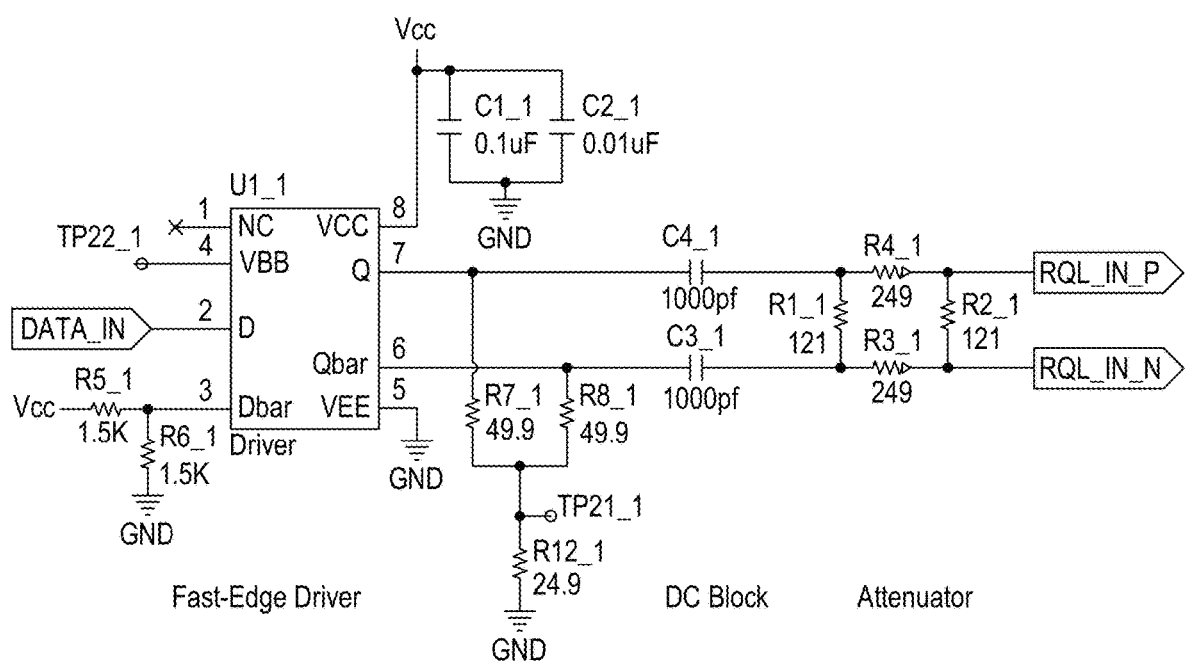
FIG. 10 is an example interface driver according to an embodiment.

FIG. 10 is an example interface driver according to an embodiment. In this example, the driver is a Multilevel Input to Differential LVPECL/LVNECL Clock or Data Receiver/Driver/Translator Buffer configured to generate high-to-low and low-to-high transitions (edges) compatible with an SC circuit (e.g., 100 ps rise and fall times). Data bits are coupled to the D input, and the Q and Qbar outputs are AC coupled (e.g., DC blocked) through 1000 pf capacitors to a 2-port differential series-parallel network attenuator comprising 249 Ohm resistors configured in series between Q and Qbar and differential outputs RQL_IN_P and RQL_IN_N and 121 Ohm resistors configured in parallel across Q and Qbar and RQL_IN_P and RQL_IN_N (as shown). The attenuation resistors and AC coupling capacitors are configured to pass a high frequency edge of the digital signal to the RQL_IN_P and RQL_IN_N inputs of the SC circuit.

Figure 11:
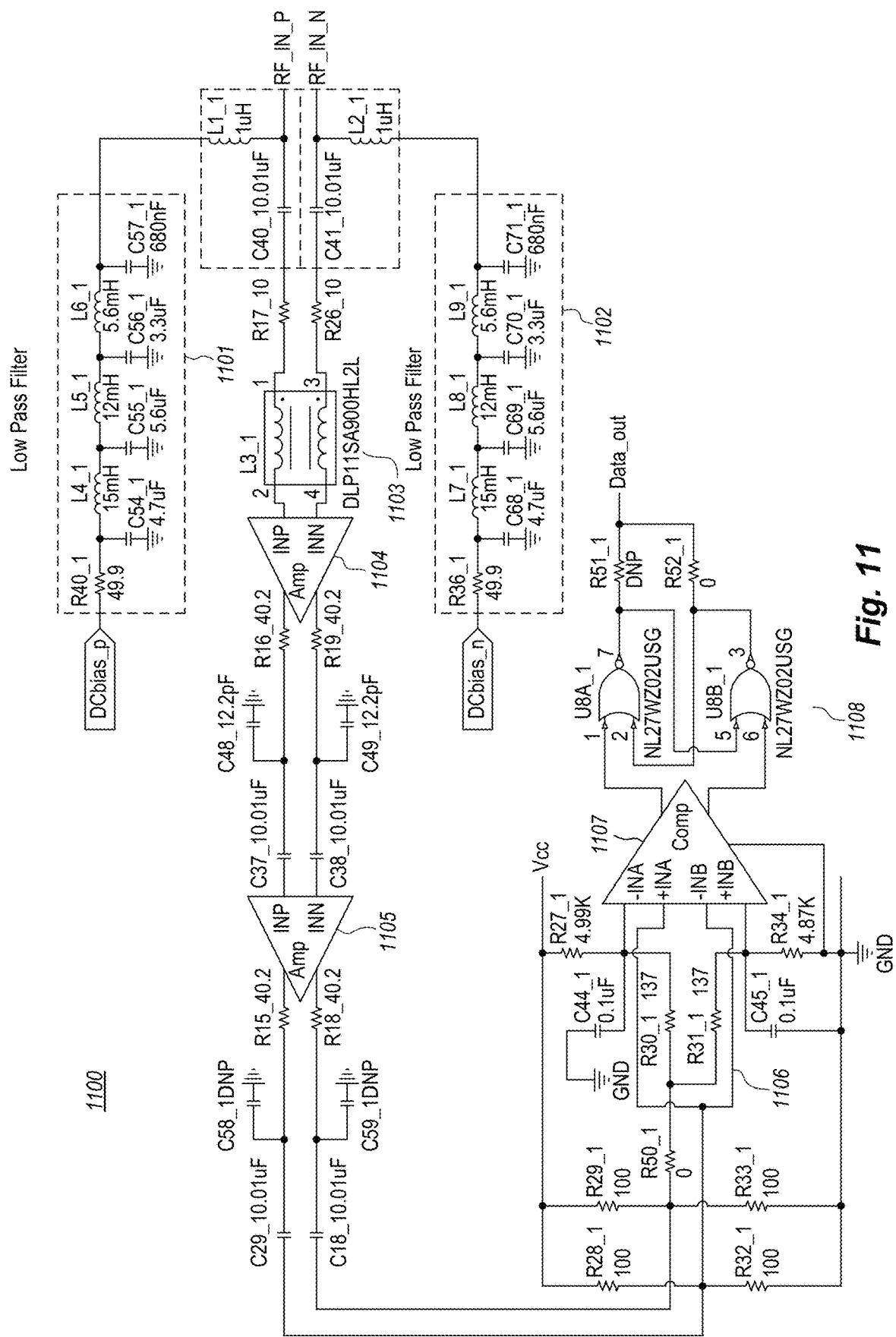
FIG. 11 is an example interface receiver according to an embodiment.

FIG. 11 is an example interface receiver 1100 according to an embodiment. In this example, the outputs of the SC circuit are differential inputs to the interface receiver 1100 labeled RF_IN_P and RF_IN_N. Positive and negative DC bias currents are coupled through low pass filters 1101-1102 and coupled through inductors L1_1 and L2_1 to set a DC bias level. The differential inputs RF_IN_P and RF INN are coupled through AC coupling capacitors and a common mode choke circuit (e.g., a transformer 1103) to the differential input of 2 stages of amplification (e.g., amplifiers 1104 and 1105) configured to have a bandwidth to amplify RQL pulses from the SC circuit, for example. The differential output of amplifier 1105 is coupled to A and B inputs of a window comparator 1107. In this example, the positive differential output of amplifier 1105 is coupled to the +INA input and −INB input of window comparator 1107. The capacitors C44/C45 provide noise filtering on the −INA and +INB nodes of the window comparator 1107. Resistors R27, R30, R31, and R34 are connected to the −INA and +INB inputs and set the thresholds of the window comparator 1107. The negative output of the differential amplifier 1105 is tied to the resistor stack, R27, R30, R31, and R34 in order to swing the thresholds of the comparator to improve the signal to noise margin of the window comparator 1107. The output of the comparator is coupled to a high speed SR flip flop. The comparator and flip flop are configured to convert the amplified RQL pulses from the SC circuit to digital signals (logic high equals Vcc and logic low equal ground). The data at the output may be read and processed by a variety of external systems. As mentioned above, the data may be test data read by JTAG compatible test equipment, for example.

Further Examples

Each of the following non-limiting features in the following examples may stand on its own or may be combined in various permutations or combinations with one or more of the other features in the examples below.

In one embodiment, the present disclosure includes a superconducting circuit comprising: a superconducting logic circuit; and a plurality of superconducting data capture circuits configured in series, wherein a first portion of the superconducting data capture circuits have outputs coupled to inputs of the superconducting logic circuit and a second portion of the superconducting data capture circuits have inputs coupled to outputs of the superconducting logic circuit, and wherein in a first mode the superconducting data capture circuits shift in data to test the superconducting logic circuit, and wherein in a second mode the superconducting data capture circuits shift out data from outputs of the superconducting logic circuit.

In one embodiment, the plurality of superconducting data capture circuits are coupled to an RQL clock signal to synchronously shift data in and out of the plurality of superconducting data capture circuits configured in series.

In one embodiment, the circuit further comprises a superconducting resonator, wherein the RQL clock signal is generated from transitions of an external clock having a lower frequency than a frequency of the superconducting resonator, and wherein a logical pulse width of the RQL clock signal is equal to the logical pulse width of the superconducting resonator.

In one embodiment, the data is shifted in at a first frequency corresponding to the external clock in a first mode, and wherein the data is processed by the superconducting logic circuit at a second frequency of the superconducting resonator in a second mode.

In one embodiment, a first superconducting data capture circuit in the series of superconducting data capture circuits is configured to receive digital bits to test the superconducting logic circuit, and a last superconducting data capture circuit in the series of superconducting data capture circuits is configured to send digital bits produced by the superconducting logic circuit.

In one embodiment, the plurality of superconducting data capture circuits comprise: a first multiplexer comprising a first input configured to receive a serial data input from an upstream superconducting data capture circuit, a second input, a select input, and an output; a second multiplexer comprising a first input coupled to the output of the first multiplexer, a second input, a select input, and an output; and a delay circuit comprising an input coupled to the output of the second multiplexer and an output coupled to the second input of the multiplexer to store data received at the first or second inputs of the second multiplexer.

In one embodiment, the second input of the first multiplexer is coupled to an output of the superconducting logic circuit, wherein a first signal coupled to the select input of the first multiplexer shifts data into the plurality of superconducting data capture circuits in a first mode and the first signal couples data from the superconducting logic circuit to the second input of the second multiplexer in a second mode.

In one embodiment, the output of the delay circuit is coupled to an input of the superconducting logic circuit.

In another embodiment, the present disclosure includes a superconducting interface circuit comprising: a single-ended to differential driver configure to receive a digital clock signal; a differential attenuator coupled to a differential output of the single-ended to differential driver; a reciprocal quantum logic (RQL) receiver circuit coupled to an output of the differential attenuator to convert the digital clock signal to an RQL clock signal; an RQL transition detection circuit configured to receive the RQL clock signal and generate one or more RQL logic pulse signals corresponding to logic transitions of the digital clock signal, the RQL logic pulse signals having a logical pulse width equal to a logical pulse width of a superconducting resonator circuit; and a plurality of RQL multiplexers configured between a plurality of superconducting logic circuits to send and receive test data to and from the superconducting logic circuits during a test mode of operation.

In one embodiment, the differential attenuator comprises a plurality of resistors configured in 2-port differential series-parallel network.

In one embodiment, the RQL transition detection circuit comprises: an RQL delay circuit having an input coupled to receive the RQL clock signal; a first RQL inverter coupled to an output of the first delay circuit; and a first RQL AND circuit having a first input coupled to the input of the RQL delay circuit and a second input coupled to an output of the first RQL inverter.

In one embodiment, the RQL delay circuit has a time delay equal to a cycle of the superconducting resonator circuit.

In one embodiment, an output of the first RQL AND circuit is an RQL logic pulse signal corresponding to a rising transition of the digital clock signal and having a logical pulse width equal to a logical pulse width of a superconducting resonator circuit.

In one embodiment, the RQL transition detection circuit further comprises: a second RQL inverter coupled to the input of the RQL delay circuit; and a second RQL AND circuit having a first input coupled to the output of the RQL delay circuit and a second input coupled to an output of the second RQL inverter.

In one embodiment, an output of the second RQL AND circuit is an RQL logic pulse signal corresponding to a falling transition of the digital clock signal and having a logical pulse width equal to a logical pulse width of a superconducting resonator circuit.

In one embodiment, the SC interface circuit further comprises: an RQL driver circuit configured to receive data from at least one of the RQL multiplexers and produce a differential signal on a differential output; an AC coupling circuit having a differential input coupled to the differential output of the RQL driver circuit; an amplification stage having a differential input coupled to a differential output of the AC coupling circuit; a comparator circuit having a differential input coupled to a differential output of the amplification stage; and a flip flop configured to store logical data values received from the RQL driver circuit.

In another embodiment, the present disclosure includes a superconducting circuit comprising: a superconducting logic circuit; a superconducting resonator circuit having a first frequency; an RQL transition detection circuit configured to receive an external clock signal having a second frequency less than the first frequency and generate one or more RQL logic pulse signals corresponding to logic transitions of the external clock signal, the RQL logic pulse signals having a logical pulse width equal to a logical pulse width of the superconducting resonator circuit; and a plurality of series coupled superconducting data capture circuits configured to shift data to and from an external data source synchronously with the superconducting resonator circuit based on at least one of the RQL logic pulse signals, wherein a first portion of the superconducting data capture circuits have outputs coupled to inputs of the superconducting logic circuit and a second portion of the superconducting data capture circuits have inputs coupled to outputs of the superconducting logic circuit to send and receive test data to and from the superconducting logic circuit.

In one embodiment, in a first mode the superconducting data capture circuits shift in data to test the superconducting logic circuit, and in a second mode the superconducting data capture circuits shift out data from outputs of the superconducting logic circuit.

In one embodiment, the plurality of superconducting data capture circuits comprise: a first multiplexer comprising a first input configured to receive a serial data input from an upstream superconducting data capture circuit, a second input, a select input, and an output; a second multiplexer comprising a first input coupled to the output of the first multiplexer, a second input, a select input, and an output; and a delay circuit comprising an input coupled to the output of the second multiplexer and an output coupled to the second input of the multiplexer to store data received at the first or second inputs of the second multiplexer.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:
1. A superconducting circuit comprising:
a superconducting logic circuit; and
a plurality of superconducting data capture circuits configured in series, the superconducting data capture circuits storing data represented as pulses,
wherein a first portion of the superconducting data capture circuits have outputs coupled to inputs of the super- conducting logic circuit and a second portion of the superconducting data capture circuits have inputs coupled to outputs of the superconducting logic circuit, and wherein in a first mode the superconducting data capture circuits shift in data to test the superconducting logic circuit, and wherein in a second mode the superconducting data capture circuits shift out data from outputs of the superconducting logic circuit.

2. The superconducting circuit of claim 1, wherein the plurality of superconducting data capture circuits are coupled to an RQL clock signal to synchronously shift data in and out of the plurality of superconducting data capture circuits configured in series.

3. The superconducting circuit of claim 2, further comprising a superconducting resonator, wherein the RQL clock signal is generated from transitions of an external clock having a lower frequency than a frequency of the superconducting resonator, and wherein a logical pulse width of the RQL clock signal is equal to the logical pulse width of the superconducting resonator.

4. The superconducting circuit of claim 3, wherein the data is shifted in at a first frequency corresponding to the external clock in a first mode, and wherein the data is processed by the superconducting logic circuit at a second frequency of the superconducting resonator in a second mode.

5. The superconducting circuit of claim 1, wherein a first superconducting data capture circuit in the series of superconducting data capture circuits is configured to receive digital bits to test the superconducting logic circuit, and a last superconducting data capture circuit in the series of superconducting data capture circuits is configured to send digital bits produced by the superconducting logic circuit.

6. The superconducting circuit of claim 1, the plurality of superconducting data capture circuits comprising:
a first multiplexer comprising a first input configured to receive a serial data input from an upstream superconducting data capture circuit, a second input, a select input, and an output;
a second multiplexer comprising a first input coupled to the output of the first multiplexer, a second input, a select input, and an output; and
a delay circuit comprising an input coupled to the output of the second multiplexer and an output coupled to the second input of the multiplexer to store data received at the first or second inputs of the second multiplexer.

7. The superconducting circuit of claim 6, wherein the second input of the first multiplexer is coupled to an output of the superconducting logic circuit, wherein a first signal coupled to the select input of the first multiplexer shifts data into the plurality of superconducting data capture circuits in a first mode and the first signal couples data from the superconducting logic circuit to the second input of the second multiplexer in a second mode.

8. The superconducting circuit of claim 6, wherein the output of the delay circuit is coupled to an input of the superconducting logic circuit.

9. A superconducting interface circuit comprising:
a single-ended to differential driver configure to receive a digital clock signal;
a differential attenuator coupled to a differential output of the single-ended to differential driver;
a reciprocal quantum logic (RQL) receiver circuit coupled to an output of the differential attenuator to convert the digital clock signal to an RQL clock signal;

an RQL transition detection circuit configured to receive the RQL clock signal and generate one or more RQL logic pulse signals corresponding to logic transitions of the digital clock signal, the RQL logic pulse signals having a logical pulse width equal to a logical pulse width of a superconducting resonator circuit; and
a plurality of RQL multiplexers configured between a plurality of superconducting logic circuits to send and receive test data to and from the superconducting logic circuits during a test mode of operation, wherein at least a portion of the plurality of RQL multiplexers store data represented as pulses.

10. The superconducting interface circuit of claim 9, wherein the differential attenuator comprises a plurality of resistors configured in 2-port differential series-parallel network.

11. The superconducting interface circuit of claim 9, wherein the RQL transition detection circuit comprises:
an RQL delay circuit having an input coupled to receive the RQL clock signal;
a first RQL inverter coupled to an output of the first delay circuit; and
a first RQL AND circuit having a first input coupled to the input of the RQL delay circuit and a second input coupled to an output of the first RQL inverter.

12. The superconducting interface circuit of claim 11, wherein the RQL delay circuit has a time delay equal to a cycle of the superconducting resonator circuit.

13. The superconducting interface circuit of claim 11, wherein an output of the first RQL AND circuit is an RQL logic pulse signal corresponding to a rising transition of the digital clock signal and having a logical pulse width equal to a logical pulse width of a superconducting resonator circuit.

14. The superconducting interface circuit of claim 11, wherein the RQL transition detection circuit further comprises:
a second RQL inverter coupled to the input of the RQL delay circuit; and
a second RQL AND circuit having a first input coupled to the output of the RQL delay circuit and a second input coupled to an output of the second RQL inverter.

15. The superconducting interface circuit of claim 14, wherein an output of the second RQL AND circuit is an RQL logic pulse signal corresponding to a falling transition of the digital clock signal and having a logical pulse width equal to a logical pulse width of a superconducting resonator circuit.

16. The superconducting interface circuit of claim 9, further comprising:
an RQL driver circuit configured to receive data from at least one of the RQL multiplexers and produce a differential signal on a differential output;
an AC coupling circuit having a differential input coupled to the differential output of the RQL driver circuit;
an amplification stage having a differential input coupled to a differential output of the AC coupling circuit;
a comparator circuit having a differential input coupled to a differential output of the amplification stage; and
a flip flop configured to store logical data values received from the RQL driver circuit.

17. A superconducting circuit comprising:
a superconducting logic circuit;
a superconducting resonator circuit having a first frequency;
an RQL transition detection circuit configured to receive an external clock signal having a second frequency less than the first frequency and generate one or more RQL logic pulse signals corresponding to logic transitions of the external clock signal, the RQL logic pulse signals having a logical pulse width equal to a logical pulse width of the superconducting resonator circuit; and a plurality of series coupled superconducting data capture circuits configured to shift data to and from an external data source synchronously with the superconducting resonator circuit based on at least one of the RQL logic pulse signals, the superconducting data capture circuits storing data represented as pulses, wherein a first portion of the superconducting data capture circuits have outputs coupled to inputs of the superconducting logic circuit and a second portion of the superconducting data capture circuits have inputs coupled to outputs of the superconducting logic circuit to send and receive test data to and from the superconducting logic circuit.

18. The superconducting circuit of claim 17, wherein in a first mode the superconducting data capture circuits shift in data to test the superconducting logic circuit, and wherein in a second mode the superconducting data capture circuits shift out data from outputs of the superconducting logic circuit.

19. The superconducting circuit of claim 17, the plurality of superconducting data capture circuits comprising:

a first multiplexer comprising a first input configured to receive a serial data input from an upstream superconducting data capture circuit, a second input, a select input, and an output;

a second multiplexer comprising a first input coupled to the output of the first multiplexer, a second input, a select input, and an output; and a delay circuit comprising an input coupled to the output of the second multiplexer and an output coupled to the second input of the multiplexer to store data received at the first or second inputs of the second multiplexer.

* * * * *